(12) United States Patent
Hotz Ordono et al.

(10) Patent No.: US 10,048,307 B2
(45) Date of Patent: Aug. 14, 2018

(54) METHOD AND SYSTEM FOR PERFORMING ELECTRICAL TESTS ON COMPLEX DEVICES

(71) Applicant: Airbus Defence and Space S.A., Getafe (ES)

(72) Inventors: Josef Ignacio Hotz Ordono, Getafe (ES); Alberto Martinez Perez, Getafe (ES); Agustin Mendez Delgado, La Rinconada (ES); Juan Manuel Mogollon, Seville (ES); Elisa Jimenez Luengo, La Rinconada (ES)

(73) Assignee: AIRBUS DEFENCE AND SPACE S.A., Getafe (ES)

( * ) Notice: Subject to any disclaimer, the term of this patent is extended or adjusted under 35 U.S.C. 154(b) by 363 days.

(21) Appl. No.: 14/964,762

(22) Filed: Dec. 10, 2015

(65) Prior Publication Data

US 2016/0169954 A1 Jun. 16, 2016

(30) Foreign Application Priority Data

Dec. 12, 2014 (EP) .................................... 14382509

(51) Int. Cl.
*G01R 31/02* (2006.01)
*G01R 31/3183* (2006.01)

(52) U.S. Cl.
CPC ......... *G01R 31/026* (2013.01); *G01R 31/021* (2013.01); *G01R 31/3183* (2013.01); *G01R 31/318357* (2013.01); *G01R 31/318364* (2013.01)

(58) Field of Classification Search
USPC ........................................... 702/58
See application file for complete search history.

(56) References Cited

U.S. PATENT DOCUMENTS

| | | | |
|---|---|---|---|
| 5,097,213 A * | 3/1992 | Hunting | G01R 31/043 324/519 |
| 5,535,223 A | 7/1996 | Horstmann et al. | |
| 5,745,501 A | 4/1998 | Gamer et al. | |
| 5,903,475 A * | 5/1999 | Gupte | G01R 31/31704 703/16 |
| 6,243,853 B1 * | 6/2001 | Parker | G01R 31/318307 716/104 |

(Continued)

OTHER PUBLICATIONS

European Search Report, dated Jun. 12, 2015.

*Primary Examiner* — Paul D Lee
(74) *Attorney, Agent, or Firm* — Greer, Burns & Crain, Ltd.

(57) ABSTRACT

A method and system for performing electrical tests on complex devices. The method comprises: a first stage that includes generating a model of the device in a digital electronic circuits description language based on stimuli transfer, preparing a stimulus vector and simulating the model with the stimulus vector for obtaining the continuity and insulation test program to be performed to the device; a second stage where the device is connected to a workbench formed by an electrical testing machine and a matrix switch via a connection interface; and a third stage where the test program on the device is executed. The system comprises the workbench and a computer system with software adapted to execute the method.

5 Claims, 3 Drawing Sheets

(56) References Cited

U.S. PATENT DOCUMENTS

| | | | |
|---|---|---|---|
| 6,430,720 B1* | 8/2002 | Frey | G01R 31/318536 714/700 |
| 6,954,076 B2 | 10/2005 | Teich | |
| 7,184,917 B2* | 2/2007 | Pramanick | G01R 31/3183 702/108 |
| 7,590,902 B1* | 9/2009 | Tabatabaei | G01R 31/318508 714/724 |
| 8,707,113 B1 | 4/2014 | Manley et al. | |
| 2004/0123206 A1 | 6/2004 | Rohrbaugh | |
| 2004/0225459 A1* | 11/2004 | Krishnaswamy | G01R 31/3183 702/57 |
| 2005/0154550 A1* | 7/2005 | Singh | G01R 31/3183 702/108 |
| 2005/0154551 A1* | 7/2005 | Pramanick | G01R 31/3183 702/119 |
| 2009/0019311 A1 | 1/2009 | Cahon et al. | |

* cited by examiner

METHOD AND SYSTEM FOR PERFORMING ELECTRICAL TESTS ON COMPLEX DEVICES

CROSS-REFERENCES TO RELATED APPLICATIONS

This application claims the benefit of the European patent application No. 14382509.9 filed on Dec. 12, 2014, the entire disclosures of which are incorporated herein by way of reference.

FIELD OF THE INVENTION

This invention refers to a method and a system for performing electrical tests on complex devices.

BACKGROUND OF THE INVENTION

The automation of the programming and/or the execution of the electrical tests to be performed to electrical devices is a goal that has led many investigations producing results as those mentioned below.

U.S. Pat. No. 5,535,223 discloses a system that provides for the verification and testing of electrical circuits and the generation of the information necessary to interface with computer aided testing equipment to physically test the fabricated circuits. The verification of the circuit is divided into two portions, functional verification and timing verification. Information generated during the verification process using the separate functional and timing verification information are then combined into a core structure from which test vectors are generated in a format compatible with a circuit testing apparatus which physically tests the fabricated circuit.

U.S. Pat. No. 6,954,076 B2 discloses an aircraft multifunction wire and low voltage insulation tester, having a time domain reflectometer, a digital multi-meter, and a matrix switch integrated in a computer, and a connector having a plurality of output pins allowing a plurality of wires to be hooked up simultaneously. The matrix switch connects the output pins to either the digital multi-meter or the time domain reflectometer perform the respective tests. Corresponding to the output pins, the matrix switch has a plurality of input/output channels, such that wire paths can be established between the output pins. The time domain reflectometry and characteristic tests can thus be performed on each line of a cable to be tested, and each wire path established between the output pins or the lines.

US 2009/019311 A1 discloses a method of preparing a test for an electronic system including a plurality of pieces of equipment interconnected by at least one communications link, in which method, in order to perform the test, use is made of a test bench appropriate for the electronic system under test, which test bench is connected to the system and controlled in application of a command sequence established from at least one informal functional specification; while preparing the test, the informal functional specification, the command sequence, and a link identifying the informal functional specification from which the command sequence was established are all recorded so that after execution of the command sequence and after the test results have been recorded, it is possible to read the link and identify unambiguously the informal functional specification that corresponds to the test results obtained.

However said prior art has not achieved a satisfactory degree of automation of the continuity and insulation electrical tests to be performed on complex devices such as control units formed by a set of electrical components connected by wires to check their proper operation.

SUMMARY OF THE INVENTION

In one aspect, the invention provides a method for performing continuity and insulation electrical tests on a device formed by a set of electrical components connected by wires (also referred to hereinafter as UUT—initials of the expression "Unit Under Test"—) on a workbench comprising an electrical testing machine and a matrix switch.

The method comprises:

a) A first stage where the program of electrical tests to be performed to the device is prepared in the following steps:

a1) Generating a model of the device in a digital electronic circuits description language based on stimuli transfer using a library that includes models of all components of the device in that language;

a2) Providing a stimulus vector for the device that stimulates all its terminals to obtain patterns of the tests in the language;

a3) Simulating the behavior of the model of the device with the stimulus vector to obtain the program of electrical tests;

b) A second stage in which the connection of the device to the workbench is made using an interface connection;

c) A third stage in which the program of electrical tests to the device is executed.

In one embodiment, the digital electronic circuits description language is the VHDL language because it is a language based on stimuli transfer and not on the resolution of circuital equations.

In one embodiment, the model of the device includes the values that can take signals of STD_LOGIC type indicative of current flow through their ohmic components. Thereby the detection of the current flow during the simulation of the model is facilitated.

In one embodiment, the matrix switch of the workbench is configured to switch the signals from the electrical testing machine with a plurality of external signals.

In another aspect, the invention provides a system for conducting electrical tests of continuity and insulation to a UUT in a workbench comprising an electrical test machine, a matrix switch, a connection interface between the matrix switch and the UUT and a computer system connected to the electrical test machine and the matrix switch comprising a software adapted to perform the aforementioned method.

Other characteristics and advantages of the present invention will be clear from the following detailed description of embodiments illustrative of its object in relation to the attached figures.

DETAILED DESCRIPTION OF THE PREFERRED EMBODIMENTS

Figure 1:
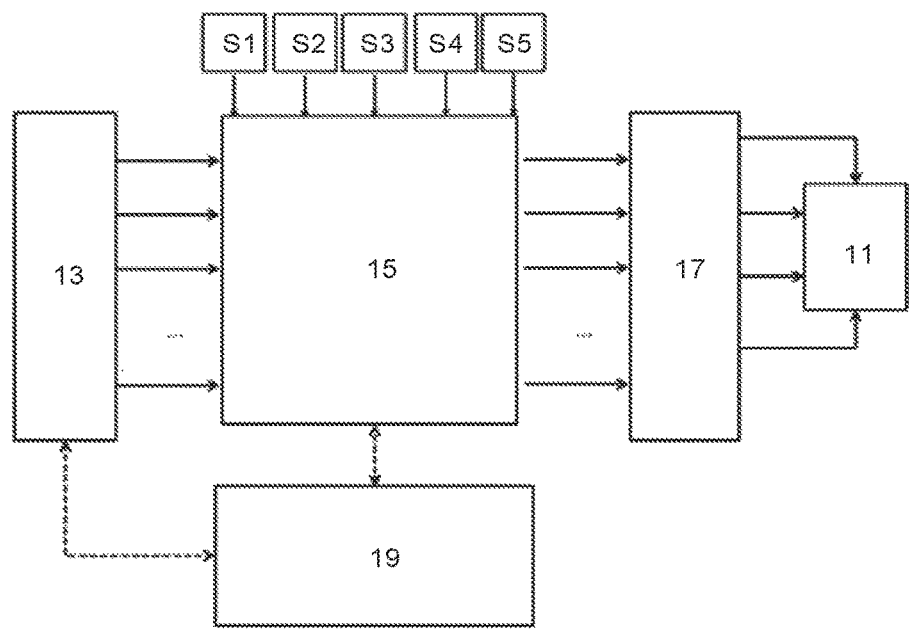
FIG. 1 is a diagram of a system for performing continuity and insulation electrical tests to a UUT.
Figure 2:
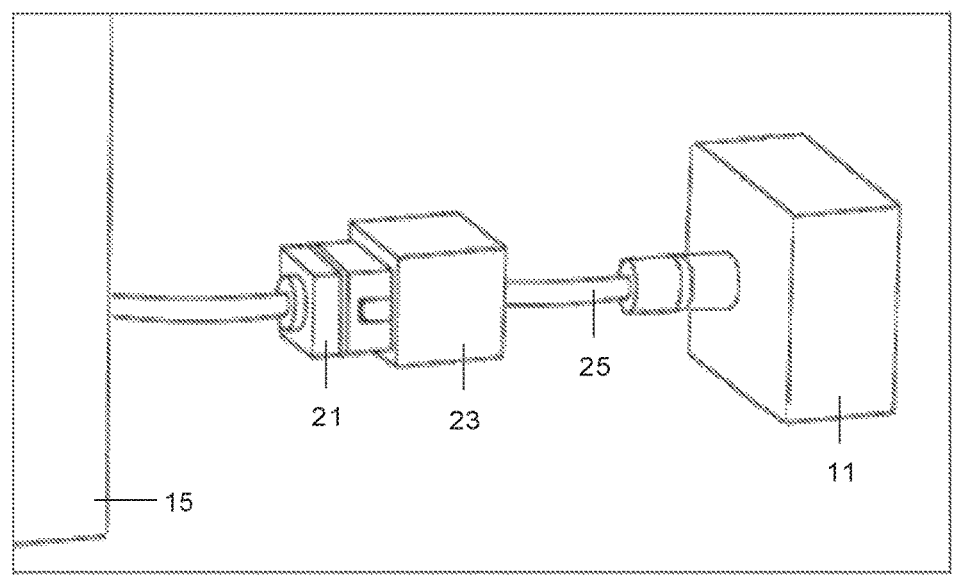
FIG. 2 is a perspective view of the connection interface between the UUT and the workbench.

A system for performing electrical tests on a UUT 11 is typically composed of (see FIG. 1):
An electrical testing machine 13 which generates electrical stimuli (current and voltage) and receives responses, so that resistance values can be measured to perform continuity and insulation tests. The machine includes stimulation and acquisition cards capable of holding thousands of possible test points.
A matrix switch 15 configurable via an Ethernet connection to electrically feed the UUT 11 automatically. It enables switching signals from the electrical testing machine 13 with up to five signals S1, S2, S3, S4, S5. These signals will usually be different voltages but may be other types of signals from external measurement equipment. In one embodiment, each module of the matrix switch 15 has a capability of switching 66 signals in six possible states: connection with the electrical testing machine 13 or with the five signals S1, S2, S3, S4, S5. The 66 circuits are distributed into two switching PCBs (initials of "Printed Circuit Board") and have a maximum switching capacity of 5 A and up to 270V. The matrix switch 15 also has a control system that receives commands via an Ethernet connection and commands each circuit to the desired state. It can be communicated with other systems via a serial connection, allowing expanding the switching capacity without adding a new Ethernet connection. The matrix switch 15 will operate in master or slave mode depending on the connection being enabled.
A connection interface 17 between the matrix switch 15 and the UUT 11 that can include adapter modules 23 between the test terminals 21 connected to the matrix switch 15 and the connectors 25 of the UUT 11 (see FIG. 2).
A computer system 19 connected to the electrical testing machine 13 and the matrix switch 15.

The devices and systems mentioned are arranged in a workbench which also includes a work table on which the UUT 11 to be subjected to the continuity and insulation electrical tests will be disposed.

The process of conducting electrical testing to a UUT 11 is typically composed of the following steps (see FIG. 3):
Stage 31: Defining the program of tests for the UUT 11 identifying the sequence of operations to be performed.
Stage 33: Connecting the UUT 11 to the matrix switch 15.
Stage 35: Executing the tests.
Stage 37: Error analysis.

Figure 3:
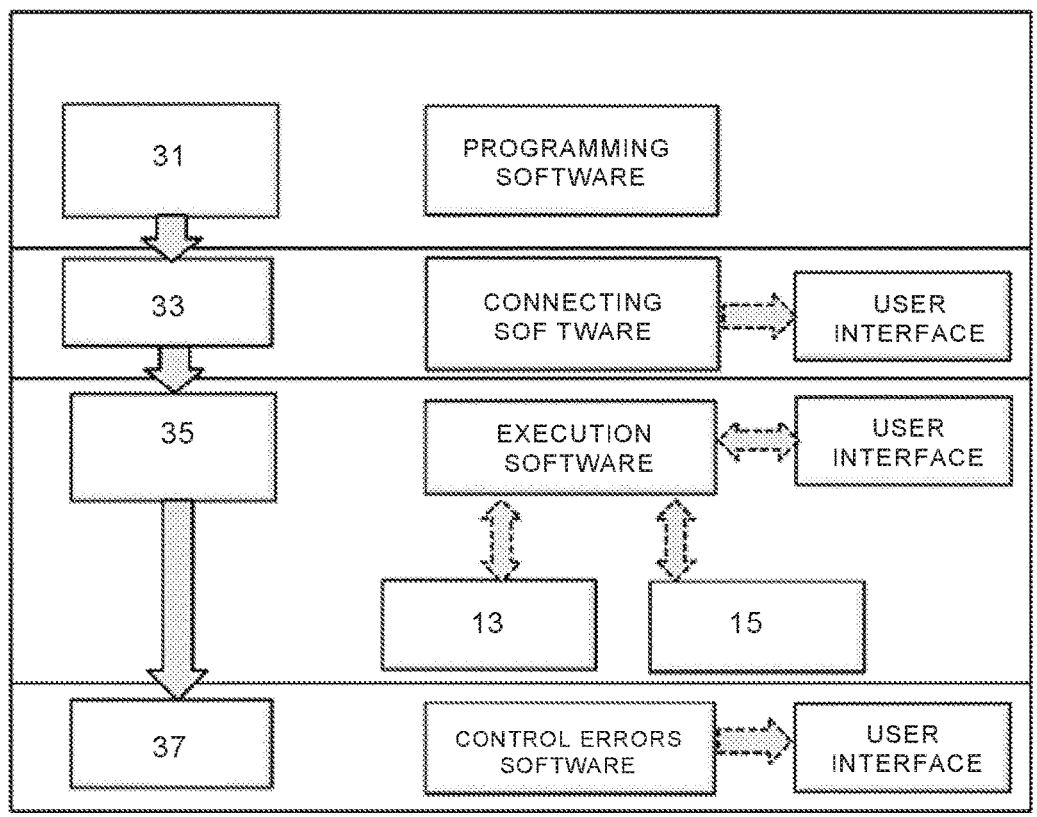
FIG. 3 is a diagram illustrating the method of the invention for performing continuity and insulation electrical tests to a UUT.

As illustrated in FIG. 3 in each of these stages different software modules of the computer system 19, having user interfaces that enable the participation of the person in charge of the tests in its execution, are involved to perform the above tasks.

The main contributions of the present invention to the electrical testing process are, firstly, incorporating to the computer system 19 a software that implements a method of semi-automatic generation of the program of tests in a pseudo code, which must be reviewed by the person in charge of the tests and, secondly, the adaptation of the computer system 19 to perform the execution of the tests from the pseudo code.

Generation of the Program of Tests

Figure 4:
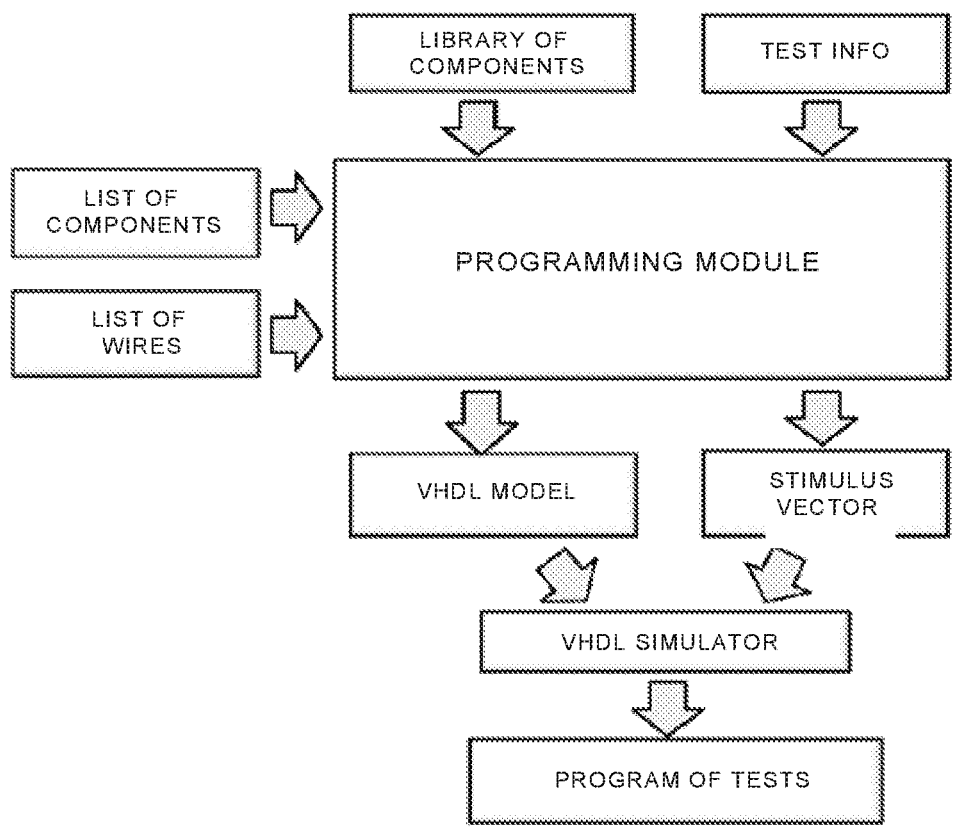
FIG. 4 is a diagram illustrating the section of the method of the invention in which the program of the tests is obtained.

The semi-automatic method for generating the program of tests for the UUT 11 comprises the following steps (see FIG. 4):

a) Providing the following information to a Programming Module:
A list identifying the components of the UUT 11.
A list identifying the wires of the UUT 11.
A library of components which allows the Programming Module obtaining information on their behavior.
Information on the tests to be performed to the UUT 11.

b) Generation by the Programming Module of a VHDL behavior model of the UUT 11 from the information provided in step a) indicating the number and typology of its components (relays, switches, selectors, pushbuttons, lamps . . . ) and their inter-connections. VHDL is a language for describing digital electronic circuits based on stimuli transfer and not on the resolution of circuital equations.

The VHDL module of UUT 11 is comprised basically of describing the inter-connection of its integrating components. This module is generated in an assisted process that requires as input the connection information and the list of components of UUT 11. Logically the library of components which is accessed in this module is a library of VHDL models of the components. A fragment of the model of a lighted pushbutton, corresponding to the description of its pin out is shown below.

```
entity AC411375A is
    Port (
        p1 : inout STD_LOGIC;
        p2 : inout STD_LOGIC;
        p3 : inout STD_LOGIC;
        p4 : inout STD_LOGIC;
        p5 : inout STD_LOGIC;
        p6 : inout STD_LOGIC;
        A1 : inout STD_LOGIC;
        A2 : inout STD_LOGIC;
        A3 : inout STD_LOGIC;
        B1 : inout STD_LOGIC;
        B2 : inout STD_LOGIC;
        B3 : inout STD_LOGIC;
        C1 : inout STD_LOGIC;
        C2 : inout STD_LOGIC;
        C3 : inout STD_LOGIC;
        D1 : inout STD_LOGIC;
        D2 : inout STD_LOGIC;
        D3 : inout STD_LOGIC;
        ENA : in STD_LOGIC;
        ACT : in STD_LOGIC;
        IsOn:out STD_LOGIC_VECTOR(3 DOWNTO 0)
    );
end AC411375A;
```

All components are modeled as logic gates, but include the ability to detect when they are in an electric path that can conduct current. For this purpose the 'weak' logical levels of type STD_LOGIC (H, L, W) specified in the standard VHDL of IEEE have being used.

Therefore, to detect in simulation current flow by some ohmic components such as lamps or diodes the use of signals of type STD_LOGIC has been exploited and the different values that can take these signals have been coded with satisfactory result, which involves an original application of the use of this language.

The following function, for example, returns a logical one if the component is in a closed electrical path with a potential difference between its ends (driving current):

```
function state(signal IN1 : std_logic; signal IN2 : std_logic)
    return std_logic is
    begin
    case IN1 is
```

-continued
```
            when '1' => if (IN2 = '0' or IN2 = 'W') then
                           return '1';
                           else return '0';
                        end if;
            when '0' => if (IN2 = '1' or IN2 = 'W') then
                           return '1';
                           else return '0';
                        end if;
            when 'W' => if (IN2 = 'W' or IN2 = '1' or IN2 = '0') then
                           return '1';
                           else return '0';
                        end if;
            when others => return '0';
         end case;
      end state;
```

In the model of the UUT 11 this component is instanced and connected symbolically to other components of the UUT 11:

```
RC27: AC411375A
Port Map(
   p1 => wire(3),
   p2 => wire(0),
   p3 => wire(2),
   p4 => wire(5),
   p5 => CONN(13),
   p6 => CONN(13),
   A1 => CONN(12),
   A2 => CONN(14),
   A3 => wire(4),
   B1 => CONN(12),
   B2 => CONN(15),
   B3 => wire(1),
   C1 => open,
   C2 => open,
   C3 => open,
   D1 => open,
   D2 => open,
   D3 => open,
   ENA => ENA,
   ACT => ACT(0),
   isOn => IND(3 downto 0)
);
```

This file is generated in a guided manner, using a spreadsheet with VBA programmed macros.

c) Generation by the Programming Module of a Stimulus Vector from the information provided in step a)

It is done through a user graphical application that allows the configuration of the UUT 11 selecting the energization and state of all actuators.

The Stimulus Vector is a module of VHDL code, not synthesizable, adapted to each UUT 11 to systematically analyze all the terminals of the UUT 11.

A fragment of the block that generate the test instructions of continuity (X, CC), insulation (TT), resistance (X, RC) and diode tests (X, BC) is shown below:

for j in 0 to CONN'LENGTH-1 loop
   Mssgs in console for Shorted terminals:

```
assert not (CONN(j) = '1' and i /= j)-- and MASK(j) = '1')
   report " CC [ " & integer'image(i) & " , " & integer'image(j) & " ]"
severity note;
      if (CONN(j) = '1' and i /= j) then -- and MASK(j) = '1') then
         file_open(log_file,"FALKENsim.log",APPEND_MODE);
         write(log_line, " X("& integer'image(i) &")");
         writeline(log_file, log_line);
         write(log_line, " CC("& integer'image(j) &")");
         writeline(log_file, log_line);
```

```
         file_close(log_file);
         TT(i) := '0';
         MASK2(j) := 'Z';
         CC(i) <= j;
         CC(j) <= i;
      elsif (CONN(j) = 'H' and i /= j and (StdLogVec_OR(RES) or StdLogVec_OR(DIO))) then
         file_open(log_file,"FALKENsim.log",APPEND_MODE);
         write(log_line, " X("& integer'image(i) &")");
         writeline(log_file, log_line);
         if StdLogVec_OR(RES) Then
            write(log_line, " RC("& integer'image(j) &")");
            writeline(log_file, log_line);
         elsif StdLogVec_OR(DIO) Then
            write(log_line, " BC("& integer'image(j) &")");
            writeline(log_file, log_line);
         End If;
         file_close(log_file);
         TT(i) := '0';
         MASK2(j) := 'Z';
      end if;
      if (CONN(j) = 'H' and MASK2(j)='1') then
         TT(i) := '0';
         MASK2(j) := 'Z';
      end if;
   end loop;
``` d) Simulating he VHDL model with the Stimulus Vector

A commercial VHDL simulator is used for the simulation. The simulation is assisted by the user, which select the configuration of the model of the UUT 11 in each run. Configuration means the state of the actuators (relays, breakers, switches, . . . ) and the state of energization of the UUT 11. Each run will generate a set of instructions (tests of continuity, insulation, resistance measurement, . . . ) as well as information on activated indicator lights. The set of all instructions constitute a program of electrical tests in a high level language different from any specific language developed for a particular electrical testing machine The simulation result is a file describing in pseudo code the sequence of electrical tests (an index that identifies the terminal of the UUT 11 is bracketed):

```
****** TEST LIGHTS (L)******
PCK2(3)
PCK3(4)
MSG CHKL(8)
DROPALL
****** STEADY STATE ******
X(19)
CC(MAS S)
...
```

The file is automatically translated to a high level test language. The result is a program of the electrical test:

```
MODOS (HAB,CES,DOF,DTB,TCM,VCN)
DEFCONT (0.01,0.001,1.0, 0.001 , 0.1)
DEFNCONT (0.01,0.001,1.0, 0.001, 0.1)
DEFAISLAT(500, 1, 100, 1, 2)
DEFAISLAP(500, 1, 100, 1, 2)
TEXTPAN(** Check that SELCAL and ALE lights in Korry HF2 when
korry is pressed. ** Check the HF2 Korry not lights when korry is not pressed**
¿CHECK CORRECT?, TRUE, FALSE)
/* CONTINUIDAD
CONT (AAA,1,BBB,2)
/* RETARDO DE 1S */
PAUSA(1)
OFF( )
```

That program will then be interpreted by the computer system 19 during the execution of the tests, so that each test pattern triggers a sequence of communication operations with the electrical testing machine 13 and the matrix switch 15. The advantage of this technique is the ability to simulate state changes of the UUT 11 through the energization of the input terminals, providing a reliable model of the behavior of the entire UUT 11.

Test Execution

The computer system 19 is adapted to execute the test in Stage 35 from the pseudo code generated in Stage 31, interpreting each line of the test program and communicating with electrical testing machine 13, the matrix switch 15 and the operator in charge of the test to perform any of the following actions:

Send resistance measurements instructions to the electrical testing machine 13.

Send energizing instructions to the matrix switch 15 to inject voltage to energize the components of the UUT 11.

Interact with the operator through a visual, graphical and assisted interface to show the connection of the UUT 11 to the workbench interface, a state change action to be executed on the UUT 11 (pressing a button, check lighting) or any state information of the test.

For this purpose the computer system 19 includes dynamic link libraries (DLL) for communication with the electrical testing machine 13, the matrix switch 15 and the connection interface 17. The user can run a program obtained by simulation, but it can also enter individual commands, so that will govern the test completely. The modularity introduced by the dynamic link libraries allow that the user interface can be a graphical application running on the user's PC or a web service running remotely.

The computer system 19 receives the response of the electrical test machine 13, the matrix switch 15 and eventually the operator. The results of each of the aforementioned steps are stored in a state file. At the end of the tests, the computer system 19 carries out the reading of the state file and shows the user the result thereof on a screen. The result is an error report with the tests not passed by the UUT 11. A further report will show the existence of electrical pathways in the UUT 11 that have not been tested.

In Step 37 of Analysis Errors advanced graphical information (if any) to facilitate repair of the UUT 11 is displayed to the operator.

The main advantages of the system of the invention are:

a) Reduction of time to prepare the test program by means of the automatic modeling of the UUT. The process of programming the tests of control units is a long and tedious task based on the experience of the engineer where is very easy to introduce errors. The invention allows programming the test in a semi-automatic and assisted manner including information on wires that have not been tested.

b) Facility for executing the test. The user interfaces of the system allow manual input commands and reading the file program that will collect the orders for the execution of the test. The process of preparation and implementation is guided, assisted and visual, showing on a screen the operations to be undertaken by the operator step by step for connecting the UUT to the electrical test machine and the intermediate processes of interaction with the UUT.

c) Adaptability. The workbench has a matrix switch 15 capable of injecting multitude of signals, such as power, other measuring equipment, etc. by the connecting line to the UUT. This is particularly useful in products requiring several different supply voltages.

d) Universality thanks to the use of an interface connection that allows testing any UUT easily and with minimal connection times.

Although the present invention has been described in connection with various embodiments, it will be appreciated from the specification that various combinations of elements, variations or improvements therein may be made, and are within the scope of the invention as defined by the appended claims.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for performing continuity and insulation electrical tests on a fabricated device formed by a set of electrical components connected by wires to a workbench comprising an electrical testing machine and a matrix switch connected to the electrical testing machine, comprising:

a) in a first stage, preparing the program of continuity and insulation electrical tests to be performed on the device with the following steps:

a1) generating a model of the device in a digital electronic circuits description language based on stimuli transfer using a library that includes models of all components of the device in that language;

a2) providing a stimulus vector for the device that stimulates all its terminals to obtain patterns of the continuity and insulation electrical tests in the digital electronic circuits description language based on stimuli transfer, wherein said stimulus vector is provided based on a configuration of the generated model that is selected via a user application;

a3) simulating the behavior of said model of the device with said stimulus vector to obtain said program of continuity and insulation electrical tests;

b) in a second stage, using a connection interface for connecting the device to the matrix switch, wherein the matrix switch is configured to switch the signals from the electrical testing machine with a plurality of external signals;

c) in a third stage, executing said program of electrical tests on the device by controlling the electrical testing machine and the matrix switch.

2. The method according to claim 1, wherein said digital electronic circuits description language is the VHDL language.

3. The method according to claim 2, wherein the model of the device includes the values that can take signals of type STD_LOGIC indicative of current flow through their ohmic components.

4. A system for conducting continuity and insulation electrical tests on a fabricated device formed by a set of electrical components connected by wires on a workbench comprising:

an electrical testing machine, a matrix switch connected to the electrical testing machine, wherein the matrix switch is configured to switch the signals from the electrical testing machine with a plurality of external signals, a connection interface between the matrix switch and the device, and a computer system connected to said electrical testing machine and said matrix switch, said computer system comprising software adapted to perform a method for performing continuity and insulation electrical tests on a device formed by a set of electrical components connected by wires on a workbench comprising an electrical testing machine and a matrix switch, comprising:

a) in a first stage, preparing the program of continuity and insulation electrical tests to be performed on the device with the following steps:

a1) generating a model of the device in a digital electronic circuits description language based on stimuli transfer using a library that includes models of all components of the device in that language;

a2) providing a stimulus vector for the device that stimulates all its terminals to obtain patterns of the continuity and insulation electrical tests in the digital electronic circuits description language based on stimuli transfer, wherein said stimulus vector is provided based on a configuration of the generated model that is selected via a user application;

a3) simulating the behavior of said model of the device with said stimulus vector to obtain said program of continuity and insulation electrical tests;

b) in a second stage, using a connection interface for connecting the device to the workbench;

c) in a third stage, executing said program of electrical tests on the device by controlling the electrical testing machine and the matrix switch.

5. The system according to claim 4, wherein the computer system comprises:

a) a programming module configured for generating:

a1) a model of the device in digital electronic circuits description language based on stimuli transfer from files with descriptive information about its components and their connections and using a library that includes models of all components of the device in said language;

a2) a stimulus vector for analyzing systematically all the terminals of the device;

b) a simulator configured for obtaining the program of continuity and insulation electrical tests to be performed to the device in a high level language from said model of the device and said stimulus vector;

c) software for executing the program of continuity and insulation electrical tests by transmitting its instructions to the electrical testing machine and to the switching matrix and controlling its execution.

\* \* \* \* \*